US007369071B2

(12) United States Patent
Pollet et al.

(10) Patent No.: US 7,369,071 B2
(45) Date of Patent: May 6, 2008

(54) ANALOG AND DIGITAL SIGNAL MIXER

(75) Inventors: Jean-François Pollet, Jarrie (FR); Guillaume Cogniard, Saint Martin D'Heres (FR)

(73) Assignee: Dolphin Integration (FR)

( * ) Notice: Subject to any disclaimer, the term of this patent is extended or adjusted under 35 U.S.C. 154(b) by 0 days.

(21) Appl. No.: 11/506,452

(22) Filed: Aug. 18, 2006

(65) Prior Publication Data

US 2007/0052572 A1 Mar. 8, 2007

(30) Foreign Application Priority Data

Aug. 18, 2005 (FR) .................................. 05 52531

(51) Int. Cl.
*H03M 1/00* (2006.01)

(52) U.S. Cl. ........................ 341/110; 341/143; 341/155

(58) Field of Classification Search .................. 341/61, 341/122, 123, 155, 143, 110
See application file for complete search history.

(56) References Cited

U.S. PATENT DOCUMENTS 5,647,008 A 7/1997 Farhangi et al.
5,729,225 A * 3/1998 Ledzius ....................... 341/61
5,748,126 A * 5/1998 Ma et al. .................... 341/143
5,835,032 A * 11/1998 Yasuda ........................ 341/61
5,835,044 A * 11/1998 Nishino ...................... 341/143
5,907,295 A * 5/1999 Lin ............................ 341/61
5,986,589 A 11/1999 Rosefield et al.
5,990,818 A * 11/1999 McGrath .................... 341/141
6,154,161 A * 11/2000 Leme et al. ................ 341/143
6,215,429 B1 * 4/2001 Fischer et al. ............. 341/139
6,255,975 B1 * 7/2001 Swanson .................... 341/143
6,577,910 B1 * 6/2003 Eastty et al. .................. 700/94
7,129,868 B2 * 10/2006 Ku ............................ 341/122

FOREIGN PATENT DOCUMENTS

WO WO 00/60901 10/2000

OTHER PUBLICATIONS

French Search Report dated Mar. 7, 2006.

* cited by examiner

*Primary Examiner*—Linh Nguyen
(74) *Attorney, Agent, or Firm*—Howard IP Law Group PC

(57) ABSTRACT

A mixer receiving a first analog signal and a first digital signal, corresponding to a succession, at a first frequency, of first messages each comprising a first number of bits, and providing a second analog signal, comprises an analog-to-digital converter of the first analog signal into a second digital signal, corresponding to a succession, at a second frequency greater than the first one, of second messages having a second number of bits smaller than the first one; a digital-to-digital converter of the second digital signal into a third one corresponding to a succession, at the second frequency, of third messages having the first number of bits; an interpolation unit providing a fourth digital signal corresponding to a succession, at the second frequency, of fourth messages having the first number of bits; an adder providing the sum of the third and fourth digital signals; and an output digital-to-analog converter.

8 Claims, 1 Drawing Sheet

ANALOG AND DIGITAL SIGNAL MIXER

BACKGROUND OF THE INVENTION

1. Field of the Invention

The present invention relates to a mixer receiving an analog signal and a digital signal and providing an analog signal obtained by mixing of the received analog and digital signals.

2. Discussion of the Related Art

FIG. 1 schematically shows such a mixer 10 receiving an analog signal $S_{I1}$, and a digital signal $S_{I2}$ corresponding to a series of digital messages, each comprising a number N of bits, provided at a frequency $F_1$. Mixer 10 provides an analog signal $S_O$. An example of application corresponds to a karaoke device for which digital signal $S_{I2}$ corresponds to a musical background and analog signal $S_{I1}$ corresponds to a voice signal provided by a microphone. Analog signal $S_O$ then corresponds to the superposition of the voice signal on the music background, and can be used to control a loudspeaker.

A first conventional example of a mixer converts digital signal $S_{I2}$ into an analog signal and adds the obtained analog signal to analog signal $S_{I1}$ to provide analog signal $S_O$. For an audio application, analog signal $S_O$ may be intended to control a class-D amplifier which drives a load, for example, a loudspeaker. However, a class-D amplifier is generally designed to be controlled by a pulse-width modulated analog signal (PWM). Although a pulse-width modulated signal is a two-state signal, it is considered as an analog signal since the average of such a signal corresponds to an analog signal. A disadvantage of the first mixer example is that, since analog signal $S_{I1}$ is generally not in the form of a pulse-width modulated signal, the sum of signal $S_{I1}$ and of the analog signal corresponding to the conversion of digital signal $S_{I2}$ does not directly provide a pulse-width modulated analog signal.

FIG. 2 shows a second example of a mixer 10 comprising an analog-to-digital converter 12 receiving analog signal $S_{I1}$ and providing a digital signal $S_{O1}$ corresponding to a succession, at frequency $F_1$, of digital messages each comprising N bits. Mixer 10 comprises an adder 14 receiving digital signal $S_{O1}$ on a first input and digital signal $S_{I2}$ on a second input and providing a digital signal $S_{SUM}$ corresponding to a succession, at frequency $F_1$, of messages each comprising N bits. Signal $S_{SUM}$ is provided to a digital-to-analog converter 16 capable of providing analog signal $S_O$. The second mixer example has the advantage that digital-to-analog converter 16 can be easily defined for signal $S_O$ to be a pulse-width modulated signal, which is then capable of directly controlling a class-D amplifier. The second example of mixer 10 is thus particularly well adapted to an audio application.

Analog-to-digital converter 12 for example is a Σ-Δ converter which comprises an analog-to-digital conversion unit (A/D) 18 receiving analog signal $S_{I1}$ and providing a digital signal $S_{D1}$ corresponding to a succession, at a frequency $F_2$ greater than frequency $F_1$, of messages each comprising M bits, M being smaller than N and for example equal to 1. Signal $S_{D1}$ is provided to a decimation and filtering unit 20 which provides digital signal $S_{O1}$. In such a type of converter 12, signal $S_{D1}$ is provided at a high frequency $F_2$ with respect to final frequency $F_1$ to reject the quantization noise outside of the useful frequency band, the decimation and filtering unit 20 especially enabling filtering this quantization noise and keeping the signal intact in the useful frequency band.

Digital-to-analog converter 16 for example is of the type comprising an interpolation unit 22 corresponding to an interpolation filter receiving digital signal $S^{SUM}$ and providing a signal $S_T$ corresponding to a succession, at a frequency $F_3$ greater than frequency $F_1$, of messages each comprising N bits. Signal $S_T$ drives a digital-to-analog conversion unit (D/A) 24 which provides analog signal $S_O$, possibly in the form of a pulse-width modulated signal.

An advantage of the second example of mixer 10 is that it can be almost totally formed of logic components, and can thus be easily made in the form of an integrated circuit. Further, such a mixer is particularly well adapted to the provision of a pulse-width modulated analog signal. However, such a mixer 10 has a relatively complex structure since it comprises decimation and filtering unit 20 which is, for example, formed of filters arranged in cascade, each performing a running average and a frequency division. Such a mixer 10 thus requires a significant silicon surface area when made in integrated form.

SUMMARY OF THE INVENTION

The present invention aims at a mixer receiving an analog signal and a digital signal and providing an analog signal, of simple design.

Another object of the present invention is to provide a mixer likely to provide a pulse-width modulated analog signal.

Another object of the present invention is to provide a mixer likely to be made in integrated form while only requiring a reduced silicon surface area.

For this purpose, the present invention provides a mixer receiving a first analog signal and a first digital signal, corresponding to a succession, at a first frequency, of first messages each comprising a first number of bits, and providing a second analog signal. This mixer comprises an analog-to-digital converter of the first analog signal into a second digital signal, corresponding to a succession, at a second frequency greater than the first frequency, of second messages each comprising a second number of bits smaller than the first number of bits; a digital-to-digital converter of the second digital signal into a third digital signal corresponding to a succession, at the second frequency, of third messages each comprising the first number of bits; an interpolation unit providing, from an interpolation of the first digital signal, a fourth digital signal corresponding to a succession, at the second frequency, of fourth messages each comprising the first number of bits; an adder providing a fifth digital signal equal to the sum of the third and fourth digital signals; and a digital-to-analog converter of the fifth digital signal into said second analog signal.

According to an embodiment of the present invention, the analog-to-digital converter only comprises a delta-sigma modulator with no decimation and filtering unit.

According to an embodiment of the present invention, the interpolation unit is a digital interpolation filter.

According to an embodiment of the present invention, the digital-to-analog converter is capable of providing the second analog signal in the form of a pulse-width-modulated signal.

According to an embodiment of the present invention, the digital-to-digital converter is capable of receiving a control signal and of having a third message of the third digital signal correspond to each second message of the second digital signal according to the control signal.

The present invention also aims at a method for mixing a first analog signal and a first digital signal corresponding to a succession, at a first frequency, of first messages each comprising a first number of bits, for providing a second analog signal, comprising the steps of converting the first analog signal into a second digital signal corresponding to a succession, at a second frequency greater than the first frequency, of second messages each comprising a second number of bits smaller than the first number of bits; converting the second digital signal into a third digital signal corresponding to a succession, at the second frequency, of third messages each comprising the first number of bits; providing a fourth digital signal corresponding to a succession, at the second frequency, of fourth messages each comprising the first number of bits by interpolation of the first digital signal; adding the third and fourth digital signals for providing a fifth digital signal; and converting the fifth digital signal into said second analog signal.

According to an embodiment of the present invention, the second analog signal is a pulse-width-modulated signal.

According to an embodiment of the present invention, the step of converting the second digital signal into the third digital signal comprises the provision, for each second message, of a third message according to a relation which depends on a control signal.

The foregoing objects, features, and advantages of the present invention will be discussed in detail in the following non-limiting description of specific embodiments in connection with the accompanying drawings.

DETAILED DESCRIPTION

Figure 2:
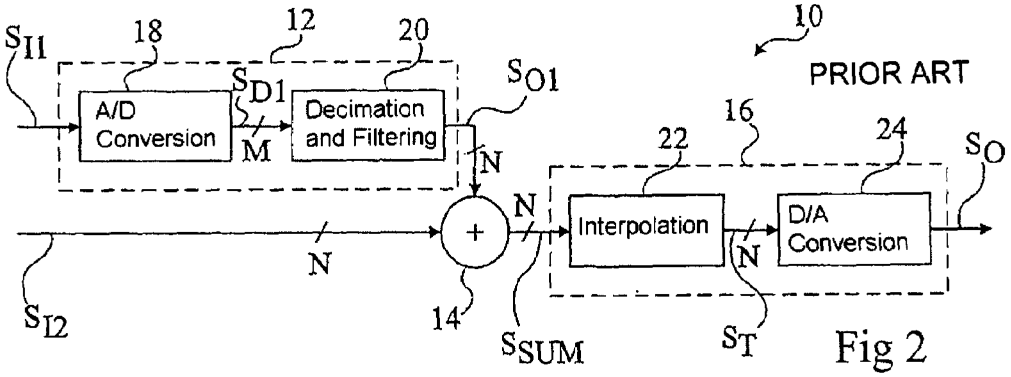
PRIOR ART Fig 2
FIG. 2, previously described, shows a conventional example of embodiment of the mixer of FIG. 1.

The present invention comprises the forming of a mixer of the type receiving a digital signal and an analog signal and providing an analog signal, in which the mixer converts the input analog signal into an intermediary digital signal at a frequency greater than the frequency of the input digital signal. The input digital signal is then interpolated to provide a digital signal at the frequency of the intermediary digital signal. Further, the intermediary digital signal is shaped up to be added to the interpolated digital signal. Once the sum has been performed, the obtained digital signal is converted into an analog signal. As compared with mixer 10 shown in FIG. 2, the mixer according to the present invention thus enables avoiding use of decimation and filtering unit 20, since analog-to-digital conversion unit 18 directly provides a digital signal $S_{D1}$ at a high frequency. This provides a mixer having a particularly simple structure.

Figure 3:
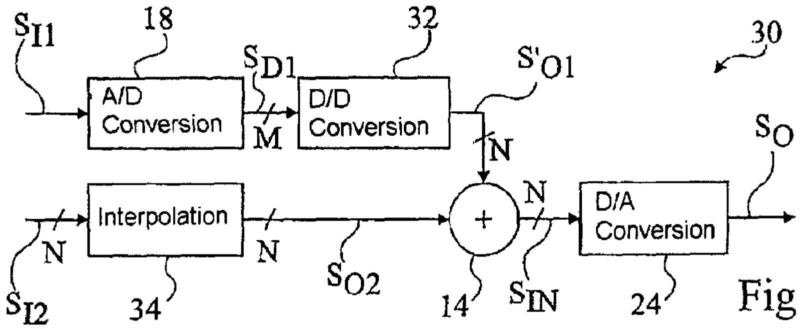
FIG. 3 shows an example of embodiment of a mixer according to the present invention.

FIG. 3 shows an example of embodiment of a mixer 30 according to the present invention. As compared with mixer 10 shown in FIG. 2, the units performing identical functions are indicated with same reference numerals. Mixer 30 comprises analog-to-digital conversion unit 18 receiving analog signal $S_{I1}$ and providing digital signal $S_{D1}$ coded over M bits at frequency $F_2$. Signal $S_{D1}$ is provided to a digital-to-digital conversion unit (D/D) 32 which provides a digital signal $S'_{O1}$ at frequency $F_2$ and coded over a number N of bits, where N is greater than M. Mixer 30 comprises an interpolation unit 34 which corresponds to an interpolation filter receiving digital signal $S_{I2}$ and providing a digital signal $S_{O2}$ coded over N bits at frequency $F_2$. This interpolation filter may be a finite or infinite pulse response filter. Interpolation unit 34 and analog-to-digital conversion unit 18 are determined to provide two digital signals $S_{O2}$ and $S_{D1}$ at the same frequency $F_2$. Digital signals $S'_{O1}$ and $S_{O2}$, coded over the same number N of bits, are provided to the inputs of adder 14, which provides a digital signal $S_{IN}$ coded over N bits at frequency $F_2$. Mixer 30 comprises digital-to-analog conversion unit 24 which receives digital signal $S_{IN}$ and provides analog signal $S_O$.

Digital-to-digital conversion unit 32 thus provides, for each digital message received from signal $S_{D1}$ coded over M bits, a digital message from signal $S'_{O1}$ coded over N bits, where N is greater than M. Such a conversion may be defined in determined fashion by a prestored correspondence table which assigns to each M-bit message an N-bit message, or may be defined programmatically. In this last case, digital-to-digital conversion unit 32 receives a control signal, not shown, enabling modification of the rules of correspondence between the M-bit messages of signal $S_{D1}$ and the associated N-bit messages of signal $S'_{O1}$. Modifying the rules of correspondence then amounts to applying a settable amplification gain to analog signal $S_{I1}$.

Figure 4:
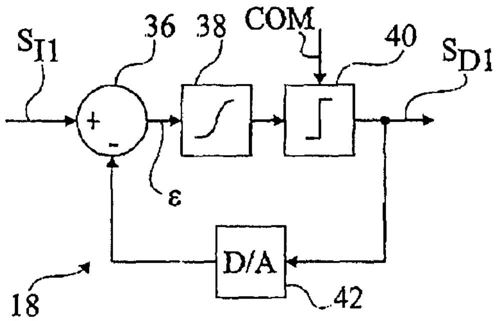
FIG. 4 shows a more detailed example of embodiment of a portion of the mixer of FIG. 3.

FIG. 4 shows an example of embodiment of Σ-Δ type conversion unit 18 which provides digital signal $S_{D1}$ coded over a number M of bits equal to 1. Unit 18 comprises a subtractor 36 having its positive input (+) receiving signal $S_{I1}$ and which provides a signal $\epsilon$ to an integrator 38. Integrator 38 drives a quantizer 40 which provides a binary signal $S_{D1}$ at frequency $F_2$ of a control signal COM. Binary signal $S_{D1}$ is converted into an analog signal by a digital-to-analog converter 42 which drives the negative input (−) of subtractor 36.

Figure 5:
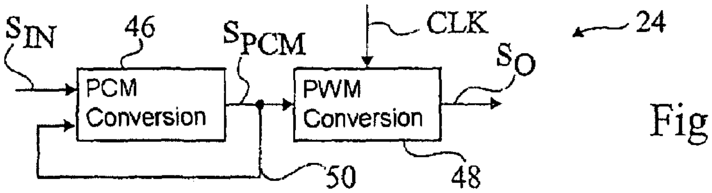
FIGS. 5 and 6 show two more detailed examples of embodiment of another portion of the mixer of FIG. 3.

FIG. 5 shows an example of embodiment of digital-to-analog converter 24 adapted to the provision of an analog signal $S_O$ in the form of a pulse-width modulated signal. Conversion unit 24 comprises a PCM conversion unit 46, also called Σ-Δ modulator (noise shaper) which receives on a first input signal $S_{IN}$ and which provides, at frequency $F_2$, a pulse-height modulated signal $S_{PCM}$ to a PWM conversion unit 48 which provides pulse-width modulated signal $S_O$. Signal $S_{PCM}$ is a digital signal corresponding to a succession, at frequency $F_2$, of messages coded over K (for example, 3 or 4) bits, and enabling coding K+1 states. Signal $S_{PCM}$ is also provided by a feedback loop 50 to a second input of PCM conversion unit 46. PWM conversion unit 48 is controlled by a control signal CLK from which signal SO is provided. Signal $S_O$ is a signal with two high and low states such that during a cycle having its duration T equal to the inverse of frequency $F_2$, the duration of signal $S_O$ in the high state depends on signal $S_{PCM}$ received by PWM conversion unit 48. The minimum duration for which signal $S_O$ can be in the high state or in the low state during a cycle characterizes the resolution of PWM conversion unit 48 and is equal to T divided by K so that signal $S_O$ can code the K+1 states that can be taken by signal $S_{PCM}$. To achieve such a resolution, control signal CLK must have a frequency equal to K times frequency $F_2$.

Figure 1:
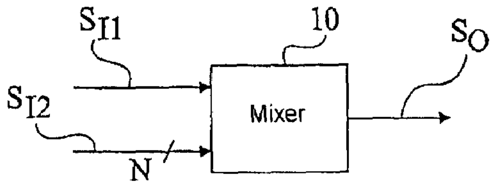
PRIOR ART Fig 1
FIG. 1, previously described, illustrates the operating principle of a mixer.
Figure 6:
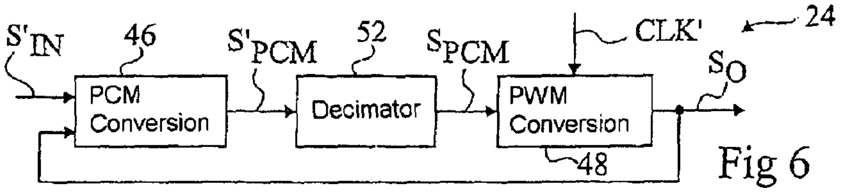

FIG. 6 shows another example of embodiment of conversion unit 24 adapted to the provision of a pulse-width modulated signal $S_O$. As compared with the example of embodiment shown in FIG. 5, PCM conversion unit 46 receives, in the present example of embodiment, signal $S_O$ directly via feedback loop 50. This enables direct taking into account, by PCM conversion unit 46, of the noise introduced by PWM conversion unit 48. PCM conversion unit 46 provides a pulse-height modulated signal $S'_{PCM}$ at frequency $F_2$ to a decimator 52 which performs an operation of decimation by a factor K, for example, by selecting one sample of signal $S'_{PCM}$ every K samples and which provides signal $S_{PCM}$ at a frequency $F_3$ equal to frequency $F_2$ divided by factor K to PWM conversion unit 48. Since signal $S_O$ is a two-state signal cyclically provided at frequency $F_3$ and that may occupy a same state for a minimum time period equal to the inverse of frequency $F_2$, it can directly be put in the form of a digital signal transmitted at frequency $F_2$ having the same number of bits as signal $S'_{IN}$, to be usable by PCM conversion unit 46. Unlike converter 10 shown in FIG. 1, PWM conversion unit 48 operates, in the present example, with a control signal CLK' at frequency $F_2$.

The present invention has many advantages:

it enables forming a mixer receiving an analog signal and a digital signal and providing a digital signal which has a particularly simple structure;

the mixer according to the present invention can be almost entirely formed of logic components and can thus be easily formed by an integrated circuit requiring a reduced silicon surface area;

the mixer according to the present invention enables directly obtaining a pulse-width modulated analog signal that can be used to control a class-D amplifier and is thus particularly well adapted to audio applications in which class-D amplifiers are generally used to control loudspeakers;

the digital-to-digital converter enables performing a simplified setting of the gain of the converted analog signal.

Of course, the present invention is likely to have various alterations, modifications, and improvements which will readily occur to those skilled in the art. In particular, the structures of analog-to-digital conversion unit 18 and of digital-to-analog conversion unit 24 may be different from the previously-described structures.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A mixer receiving a first analog signal and a first digital signal, corresponding to a succession, at a first frequency, of first messages each comprising a first number of bits, and providing a second analog signal, comprising an analog-to-digital converter of the first analog signal into a second digital signal, corresponding to a succession, at a second frequency greater than the first frequency, of second messages each comprising a second number of bits smaller than the first number of bits;

a digital-to-digital converter of the second digital signal into a third digital signal corresponding to a succession, at the second frequency, of third messages each comprising the first number of bits;

an interpolation unit providing, from an interpolation of the first digital signal, a fourth digital signal corresponding to a succession, at the second frequency, of fourth messages each comprising the first number of bits;

an adder providing a fifth digital signal equal to the sum of the third and fourth digital signals; and a digital-to-analog converter of the fifth digital signal into said second analog signal.

2. The mixer of claim 1, wherein the analog-to-digital converter only comprises a delta-sigma modulator with no decimation and filtering unit.

3. The mixer of claim 1, wherein the interpolation unit is a digital interpolation filter.

4. The mixer of claim 1, wherein the digital-to-analog converter is capable of providing the second analog signal in the form of a pulse-width modulated signal.

5. The mixer of claim 1, wherein the digital-to-digital converter is capable of receiving a control signal and of having a third message of the third digital signal correspond to each second message of the second digital signal according to the control signal.

6. A method for mixing a first analog signal and a first digital signal corresponding to a succession, at a first frequency, of first messages each comprising a first number of bits, for providing a second analog signal, comprising the steps of:

converting the first analog signal into a second digital signal corresponding to a succession, at a second frequency greater than the first frequency, of second messages each comprising a second number of bits smaller than the first number of bits;

converting the second digital signal into a third digital signal corresponding to a succession, at the second frequency, of third messages each comprising the first number of bits;

providing a fourth digital signal corresponding to a succession, at the second frequency, of fourth messages each comprising the first number of bits by interpolation of the first digital signal;

adding the third and fourth digital signals for providing a fifth digital signal; and converting the fifth digital signal into said second analog signal.

7. The method of claim 6, wherein the second analog signal is a pulse-width modulated signal.

8. The method of claim 6, wherein the step of converting the second digital signal into the third digital signal comprises the provision, for each second message, of a third message according to a relation which depends on a control signal.

* * * * *